United States Patent
Manda et al.

(10) Patent No.: US 10,396,799 B1
(45) Date of Patent: Aug. 27, 2019

(54) CIRCUIT FOR AND METHOD OF ACCESSING MEMORY ELEMENTS IN AN INTEGRATED CIRCUIT DEVICE

(71) Applicant: Xilinx, Inc., San Jose, CA (US)

(72) Inventors: Vishwak R Manda, Hyderabad (IN); Sree RKC Saraswatula, Hyderabad (IN); Santosh Yachareni, Hyderabad (IN); Shidong Zhou, Milpitas, CA (US); Jing Jing Chen, San Jose, CA (US); Michael Tsivyan, Campbell, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/839,462

(22) Filed: Dec. 12, 2017

(51) Int. Cl.
H03K 19/177 (2006.01)
H03K 19/00 (2006.01)
H03K 19/0185 (2006.01)

(52) U.S. Cl.
CPC ... *H03K 19/17756* (2013.01); *H03K 19/0016* (2013.01); *H03K 19/018585* (2013.01); *H03K 19/17732* (2013.01); *H03K 19/17784* (2013.01)

(58) Field of Classification Search
CPC ....... H03K 19/0016; H03K 19/018585; H03K 19/17732; H03K 19/17756; H03K 19/17784
See application file for complete search history.

(56) References Cited

U.S. PATENT DOCUMENTS

| | | | | |
|---|---|---|---|---|
| 5,705,938 A | * | 1/1998 | Kean | H03K 19/17704 326/39 |
| 5,801,547 A | * | 9/1998 | Kean | H03K 19/17736 326/38 |
| 6,057,704 A | * | 5/2000 | New | H03K 19/17704 326/38 |
| 6,239,616 B1 | | 5/2001 | Churcher et al. | |
| 6,914,449 B2 | | 7/2005 | Kaviani | |
| 6,956,776 B1 | | 10/2005 | Lowe et al. | |
| 7,199,608 B1 | | 4/2007 | Trimberger | |

(Continued)

OTHER PUBLICATIONS

Xilinx, "Virtex-6 FPGA Configurable Logic Block User Guide," UG364 (v1.2), Feb. 3, 2012, pp. 1-50, Xilinx, Inc., San Jose, California, USA.

(Continued)

*Primary Examiner* — Alexander H Taningco
*Assistant Examiner* — Kurtis R Bahr
(74) *Attorney, Agent, or Firm* — John J. King

(57) ABSTRACT

A circuit for accessing memory elements in an integrated circuit device is described. The circuit comprises a first plurality of memory elements; first line drivers, each of the first line drivers configured to provide a signal to a memory element of the first plurality of memory elements; first line driver buffers configured to control the signals provided by the first line drivers to the first plurality of memory elements; a second plurality of memory elements; second line drivers, each of the second line drivers configured to provide a signal to a memory element of the second plurality of memory elements; second line driver buffers configured to control the signals provided by the second line drivers to the second plurality of memory elements; and wherein one or both of the first line driver buffers and the second line driver buffers are configured to be selectively disabled.

20 Claims, 6 Drawing Sheets

(56) References Cited

U.S. PATENT DOCUMENTS

| | | | |
|---|---|---|---|
| 7,668,186 B1 | 2/2010 | Nelson, IV et al. | |
| 7,996,649 B1 | 8/2011 | Asserhall | |
| 8,116,334 B1 | 2/2012 | Neuendorffer | |
| 8,943,240 B1 | 1/2015 | Subramanian | |
| 9,620,185 B1 * | 4/2017 | Jeong | G11C 5/14 |
| 9,711,194 B2 | 7/2017 | Blott et al. | |
| 2001/0052794 A1 * | 12/2001 | Hidaka | G11C 5/14 326/83 |
| 2008/0250167 A1 * | 10/2008 | Kuroda | G06F 13/385 710/31 |
| 2016/0180934 A1 * | 6/2016 | Sakui | G11C 16/0483 365/185.11 |

OTHER PUBLICATIONS

Xilinx, "7 Series FPGAs Configurable Logic Block User Guide," UG474 (v1.8), Sep. 27, 2016, pp. 1-74, Xilinx, Inc., San Jose, California, USA.

Xilinx, "UltraScale Architecture Configurable Logic Block User Guide," UG574 (v1.5), Feb. 28, 2017, pp. 1-58, Xilinx, Inc., San Jose, California, USA.

* cited by examiner

CIRCUIT FOR AND METHOD OF ACCESSING MEMORY ELEMENTS IN AN INTEGRATED CIRCUIT DEVICE

TECHNICAL FIELD

The present invention relates generally to integrated circuit devices, and in particular, to circuits for and methods of accessing memory elements in an integrated circuit device.

BACKGROUND

A reference voltage supply used in an integrated circuit may vary between integrated circuits, and has generally been decreasing over time. As the reference voltage supply and transistor sizes for integrated circuit devices continue to decrease, the operation of circuits can be affected. Such a decrease in a reference voltage of an integrated circuit device can affect memory elements of the integrated circuit device. For example, as the reference voltage for the integrated circuit device is decreased, the read range for memory elements of the device is decreased.

By way of example, with an approximate reference voltage of 1.8 volts in a conventional integrated circuit device, a PMOS differential pair is functional up to 0.85 volts of read voltage. However, as a supply voltage for integrated circuits continues to decrease below 1.8 volts, such as to 1.5 volts, it becomes more challenging for the PMOS differential pair to function because it is difficult to achieve the 0.85 volts of read voltage. More particularly, this reduction in reference voltage can affect the operation of an integrated circuit, such as accessing memory elements of the integrated circuit. Further, slew rates can also affect signals used to access memory elements of an integrated circuit, such as signal driven by address line drivers.

Accordingly, there is a need to improve read and write operations for an integrated circuit device.

SUMMARY

A circuit for accessing memory elements in an integrated circuit device is described. The circuit comprises a first plurality of memory elements; first line drivers, each of the first line drivers configured to provide a signal to a memory element of the first plurality of memory elements; first line driver buffers configured to control the signals provided by the first line drivers to the first plurality of memory elements; a second plurality of memory elements; second line drivers, each of the second line drivers configured to provide a signal to a memory element of the second plurality of memory elements; second line driver buffers configured to control the signals provided by the second line drivers to the second plurality of memory elements; and wherein one or both of the first line driver buffers and the second line driver buffers are configured to be selectively disabled.

A method for accessing memory elements in an integrated circuit device is also described. The method comprises configuring each line driver of a first plurality of line drivers to provide a signal to a memory element of the first plurality of memory elements; configuring first line driver buffers to control the signals provided by the first line drivers to the first plurality of memory elements; configuring each line driver of a second plurality of line drivers to provide a signal to a memory element of a second plurality of memory elements; configuring second line driver buffers to control the signals provided by the second line drivers to the second plurality of memory elements; and wherein one or both of the first line driver buffers and the second line driver buffers are configured to be selectively disabled.

DETAILED DESCRIPTION

The circuits and methods set forth below improve the operation of accessing memory elements of an integrated circuit, such as reading from or writing to memory elements. The circuits and methods selectively control address line driver buffers associated with memory elements of an integrated circuit, and more particularly, selectively disable a portion of the address line driver buffers associated with the memory elements. According to one implementation, a unity gain buffer (UGB) output is used as a global supply for address line driver buffers, where a power supply grid may be provided for the address line buffers.

According to another aspect of the invention, a novel UGB is implemented, where an n-type metal oxide semiconductor (NMOS) differential pair is shared between read and write modes by dynamically switching from a p-type metal oxide semiconductor (PMOS) differential pair to NMOS differential pair during a read mode for extending the read range for memory elements. Switching from the PMOS differential pair to the NMOS differential pair is implemented based on read or write operation for accurately margining the read and write operations of the configuration memories. The UGB may be an integrated UGB that is implemented to share control logic, contention logic, Nwell steering and multiplexing of inputs, and generate different outputs to reduce the frame loading. By way of example, two separate outputs could be generated to cut frame loading for a partial reconfiguration in half.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
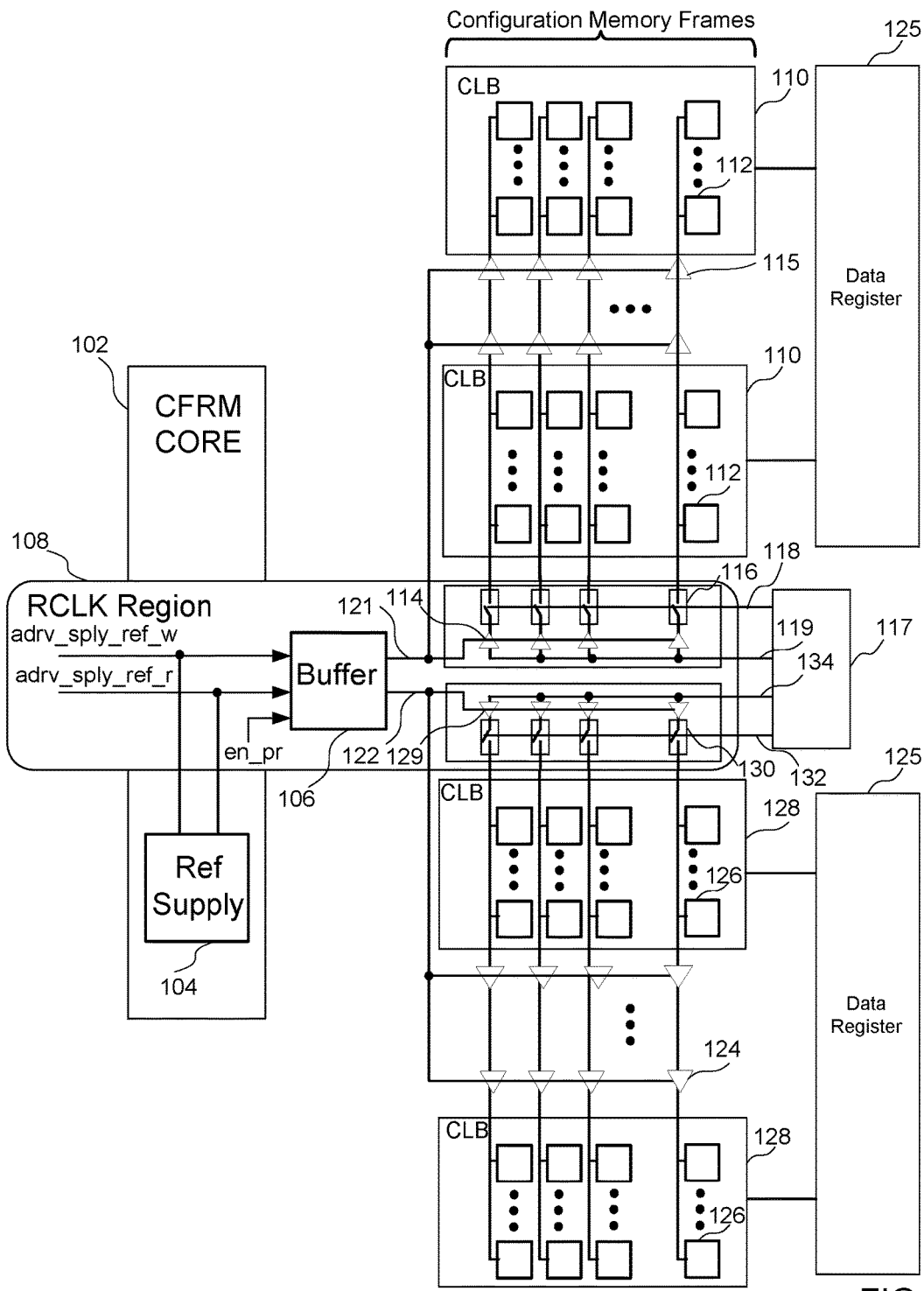
FIG. 1 is a block diagram of a circuit for configuring memory elements of an integrated circuit device.

Turning now to FIG. 1, a block diagram of a circuit for configuring memory elements of an integrated circuit device is shown. A configuration core 102 comprises a reference supply 104 configured to provide a first reference voltage (advr_sply_ref_w) for a write operation and a second reference voltage (advr_sply_ref_r) for a read operation to a buffer 106 of a (RCLK) Horizontal/Row Configuration region 108, which may be a unity gain buffer (UGB). The buffer 106 selectively provides a reference voltage to line driver buffers associated with memory elements of the integrated circuit device. According to one implementation, programmable resources 110, shown in the example of FIG. 1 as configurable logic blocks (CLBs), include memory elements 112. As will be described in more detail below, configuration memory frames may be downloaded during a configuration or partial reconfiguration to many different types of programmable resources. The memory elements 112 may comprise distributed random access memory, and may store data associated with the configuration of the programmable memory element, such as the configuration of a CLB, or data stored by the programmable resources, such as data stored by a BRAM for example. Line drivers 114 for lines and line driver buffers 115 are positioned at predetermined locations along the lines for driving the memory elements of the programmable resources. By way of example, the line driver buffers may be implemented after a predetermined number of interconnect tiles, such as four interconnect tiles of the programmable resources 110.

Switches may be implemented with the line drivers to correctly address the memory elements to read or write data to the memory elements. More particularly, line drivers 114, one for each of a top half of the memory elements and a bottom half of the memory elements, are coupled to switches 116 associated with columns of memory elements and enable the selection of a memory element is the corresponding column. Line driver buffers 115 are provided along the address lines for example for selecting a memory element 112. A power-on reset (POR) logic circuit 117 controls switches 116 by way of control lines 118 to enable the selection of a column associated with a column of memory elements to provide access to the memory elements by way of lines 119. By way of example, the lines 119 could be address lines for accessing the memory elements. That is, an appropriate address line is gated by the switches 116 under the control of the POR logic circuit 117.

The buffer 106 is provided for generating a power reference voltage for powering to the line drivers 114 and the line driver buffers 115. The buffer 106 may comprise a unity gain buffer, and may generate a plurality of outputs to reduce the frame loading. According to the example of FIG. 1, a first output 121 of the buffer 106 is configured to provide power to the line drivers 114 and the line driver buffers 115 in the top half of memory elements and a second output 122 of the buffer 106 is configured to provide power to the line drivers 129 and the line driver buffers 124 on the bottom half of memory elements 126 of programmable resources 128. The POR logic circuit 117 also controls switches 130 by way of control lines 132 to enable the selection of a column associated with a column of memory elements to provide access to the memory elements by way of lines 134. Data is provided by way of data registers 125. While 2 outputs are shown by way of example, it should be understood that additional outputs could be provided to divide the memory elements into more groups and further reduce the frame loading. The buffer 106 may also receive different reference supplies, shown here as a write reference voltage (adrv_sply_ref_w) and a read reference voltage (advr_sply_ref_r). A different supply voltage may be provided as the first output 121 and the second output 122 based upon the operation associated with memory elements, as will be described in more detail below. The buffer 106 may also receive an enable signal (en_pr) for selectively routing a supply voltage to either the line driver buffers 115 associated with memory elements 112 in the top half of the memory elements or to line driver buffers 124 associated with memory elements 126 in the bottom half of the memory elements. Such a selection of powering line drivers 114 and the line driver buffers 115 for the top half of memory elements or the line drivers 129 and the line driver buffers 124 for the bottom half of memory elements may be implemented in response to the enable signal during a partial reconfiguration of the integrated circuit device.

Figure 2:
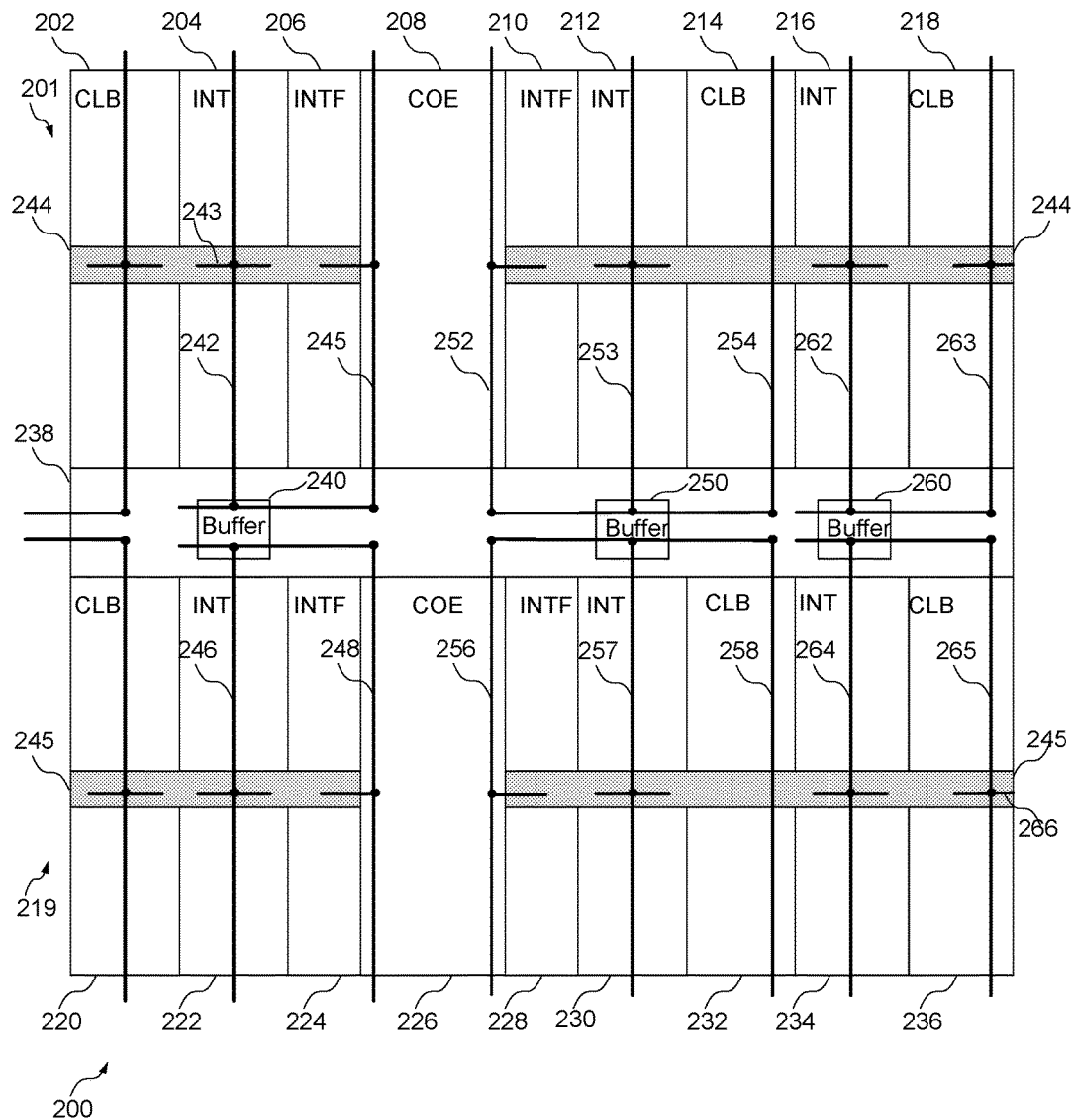
FIG. 2 is a block diagram of a circuit for configuring memory elements using a plurality of buffers.

Turning now to FIG. 2, a block diagram of a circuit for configuring memory elements using buffers is shown. More particularly, FIG. 2 shows the distribution of buffers (which correspond to buffer 106 of FIG. 1) for selectively powering liner driver buffers associated with lines as shown in FIG. 1, such as address lines, for accessing the memory elements. As shown in FIG. 2, a plurality of buffers for powering line driver buffers as described above in reference to FIG. 1 are distributed in a portion 200 of an integrated circuit having memory elements, and power line drivers and line driver buffers associated with different types of integrated circuits arranged in columns for example. An upper portion 201 comprises a plurality of columns of programmable resources, including for example a column 202 of CLBs, a column 204 of interconnect (INT) elements, a column 206 of interface (INTF) elements, a column 208 of COEs (which may comprise distributed random access memory elements), a column 210 of INTF elements, a column 212 of INT elements, a column 214 of CLBs, a column 216 of INT elements, and a column 218 of CLB elements. Similarly, a lower portion 219 comprises a plurality of columns of programmable resources, including a column 220 of CLBs, a column 222 of interconnect (INT) elements, a column 224 of interface (INTF) elements, a column 226 of COEs, a column 228 of INTF elements, a column 230 of INT elements, a column 232 of CLBs, a column 234 of INT elements, and a column 236 of CLB elements.

As shown in FIG. 2, buffers 240, 250 and 260, which are implemented as described above in reference to buffer 106 of FIG. 1, are distributed to provide power to the line driver buffers associated with memory elements of programmable resources. By way of example, a buffer 240 provides power to line driver buffers in the column 204 of INT elements by way of a vertical conductive element 242, and may comprise a horizontal conductive element 243 of a power grid 244 that enables routing of power to line driver buffers by way of other vertical conductive elements for example. Buffer 240 is also configured to provide power to line driver buffers in a column 206 of INTF elements. The buffer 240 is also configured to provide power to line driver buffers associated with memory elements in different columns in the bottom half of the circuit. That is, the buffer 240 is configured to provide power to line driver buffers in the column 222 by way of a vertical conductive element 246 and in the column 224 by way of a vertical conductive element 248.

A buffer 250 provides power to line driver buffers in column 208 of COE elements, column 210 by way of a vertical conductive element 252, and column 212 by way of vertical conductive element 253, and column 214 by way of vertical conductive element 254. The buffer 250 is also configured to provide power to line driver buffers associated with memory elements in different columns in the bottom half of the circuit. More particularly, the buffer 250 is configured to provide power to line driver buffers in the column 226 of COEs by way of vertical conductive elements 256 and column 228 of INTF elements by way of a vertical conductive element 257, in the column 230 of INT elements by way of a vertical conductive element 257, and in column 232 of CLBs by way of vertical conductive element 258.

A buffer 260 provides power to line driver buffers in the column 216 of INT elements by way of a vertical conductive element 262. Buffer 260 is also configured to provide power to line driver buffers in a column 218 of CLBs by way of vertical conductive element 263. The buffer 260 is also configured to provide power to line driver buffers associated with memory elements in different columns in the bottom half of the circuit. That is, the buffer 260 is configured to provide power to line driver buffers in the column 234 by way of a vertical conductive element 264 and in the column 236 by way of a vertical conductive element 265 and horizontal conductive element 266.

The arrangement of buffers 240, 250, and 260 and the power lines reduces the slew rate and provides offset Improvement. That is, by routing reconfiguration signals to only a portion of the memory elements, the slew rate for the reconfiguration signals can be reduced. Further, by routing the control signals using a power grid comprising horizontal and vertical conductive elements for powering drivers 114 and driver buffers 115 associated with the upper portion of the memory elements and for powering the line drivers 129 and line driver buffers 124 associated with the lower portion of memory elements, slew rate can be reduced. Further, by utilizing an output of a buffer, such as a unity gain buffer (UGB), as a Global Supply for address line driver buffers, also known as re-buffers, a voltage offset can be reduced by reducing a voltage drop associated with a reference voltage provided to the line driver buffers. According to one implementation, such a reduction in voltage offset can be achieve by using low resistance traces of the integrated circuit to route the reference voltage to the line driver buffers. By way of example, in an integrated circuit comprising interconnect layers having different dimensions, interconnect layers having less resistance may be chosen to route the reference voltage to the line driver buffers to provide a supply grid.

Further, a partial reconfiguration feature to enable/disable either one or both of the line drivers and line driver buffers that drives the address lines associated with memory elements on the top portion and memory elements on the bottom portion. Such an arrangement reduces voltage offset by reducing the frame load in half, where the total leakage current is also decreased in half. Slew rate on address line driver implemented according to the embodiment of FIG. 1 may reduce slew rate to approximately 15 ns, which may be one quarter of the slew rate associated with conventional devices. Further, the arrangement of FIG. 1 may have a frame loading of 392 frames, compared to a frame loading in a conventional arrangement of 92 frames. The read range is also improved, where a control feature to improve the read range, can dynamically switch between NMOS or PMOS asymmetrical differential pairs, as will be described in more detail below.

Figure 3:
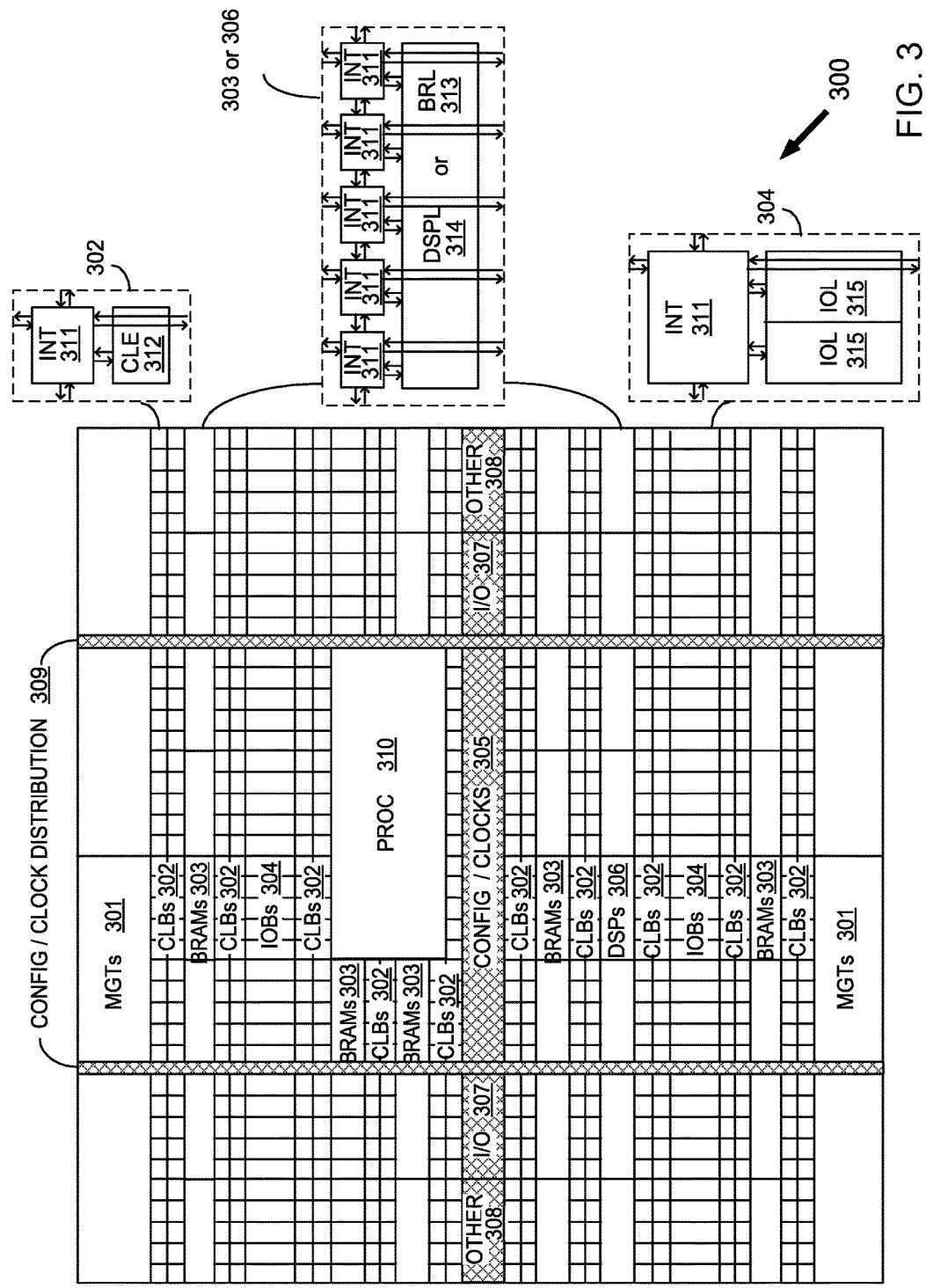
FIG. 3 is a block diagram of an integrated circuit having programmable resources.

Turning first to FIG. 3, a block diagram of an integrated circuit having programmable resources is shown, where FIGS. 1 and 2 could be implemented in the integrated circuit of FIG. 3. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 3 comprises an FPGA architecture 300 having a large number of different programmable tiles including multi-gigabit transceivers (MGTs) 301, CLBs 302, random access memory blocks (BRAMs) 303, input/output blocks (IOBs) 304, configuration and clocking logic (CONFIG/CLOCKS) 305, digital signal processing blocks (DSPs) 306, specialized input/output blocks (I/O) 307 (e.g., configuration ports and clock ports), and other programmable logic 308 such as digital clock managers, analog-to-digital converters, system monitoring logic, and so forth. Some FPGAs also include dedicated processor blocks (PROC) 310, which may be used to implement a software application, for example.

In some FPGAs, each programmable tile includes a programmable interconnect element (INT) 311 having standardized connections to and from a corresponding interconnect element in each adjacent tile. Therefore, the programmable interconnect elements taken together implement the programmable interconnect structure for the illustrated FPGA. The programmable interconnect element 311 also includes the connections to and from the programmable logic element within the same tile, as shown by the examples included at the top of FIG. 3.

For example, a CLB 302 may include a configurable logic element (CLE) 312 that may be programmed to implement user logic plus a single programmable interconnect element 311. A BRAM 303 may include a BRAM logic element (BRL) 313 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 306 may include a DSP logic element (DSPL) 314 in addition to an appropriate number of programmable interconnect elements. An IOB 304 may include, for example, two instances of an input/output logic element (IOL) 315 in addition to one instance of the programmable interconnect element 311. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 309 extending from this column are used to distribute the clocks and configuration signals across the breadth of the FPGA. Some FPGAs utilizing the architecture illustrated in FIG. 3 include additional logic blocks that disrupt the regular columnar structure making up a large part of the FPGA. The additional logic blocks may be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear in order to facilitate the efficient implementation of user logic. While the implementation of FIG. 3 relates to an integrated circuit having programmable resources, it should be understood that the circuits and methods set forth in more detail below could be implemented in any type of ASIC.

Figure 4:
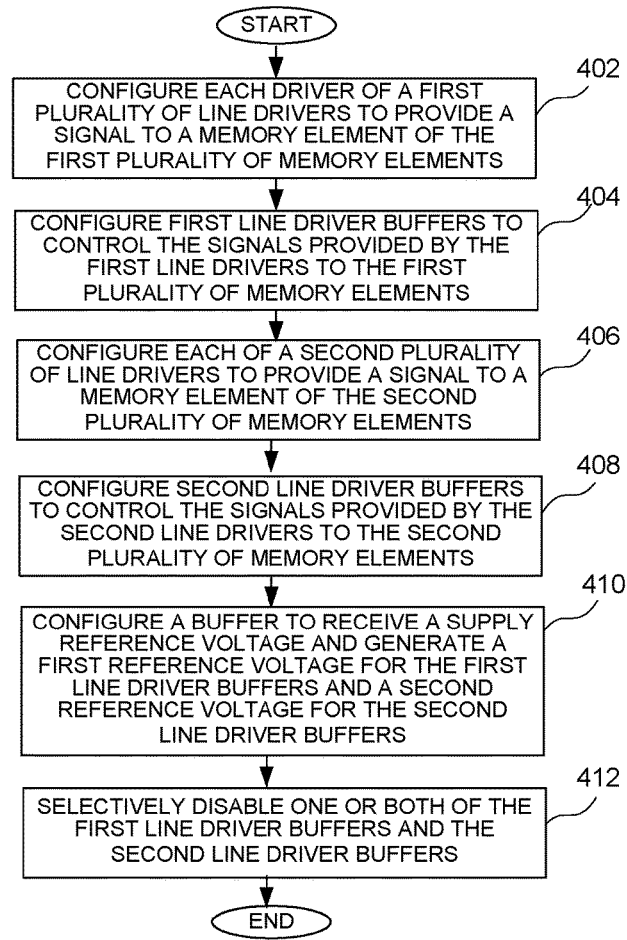
FIG. 4 is a flow diagram describing a method of accessing memory elements in an integrated circuit device.

Turning now to FIG. 4, a flow diagram describes a method of accessing memory elements in an integrated circuit device. The method of FIG. 4 may be implemented using the circuits of FIGS. 1-3 for example, or using other suitable circuits. Each driver of a first plurality of line drivers is configured to provide a signal to a memory element of the first plurality of memory elements at a block 402. First line driver buffers are configured to control the signals provided by the first line drivers to the first plurality of memory elements at a block 404. The first line drivers ma drive address lines that are associated with the first plurality of memory elements and the second line drivers may drive address lines that are associated with the second plurality of memory elements. According to some implementations, the first plurality of memory elements and the second plurality of memory elements comprise distributed random access memory of the integrated circuit device.

Each of a second plurality of line drivers is configured to provide a signal to a memory element of the second plurality of memory elements at a block 406. Second line driver buffers are configured to control the signals provided by the second line drivers to the second plurality of memory elements at a block 408. A buffer, such as a unity gain buffer, is configured to receive a supply reference voltage and generate a first reference voltage for the first line driver buffers and a second reference voltage for the second line driver buffers at a block 410. One or both of the first line driver buffers and the second line driver buffers may be selectively disabled at a block 412.

Configuring the buffer may comprise coupling the buffer to the line drivers and enabling a partial reconfiguration of the integrated circuit device. That is, a circuit may be configured to apply an output to a first portion of memory elements during a first partial reconfiguration, and apply an output to a second portion of memory elements during a second partial reconfiguration. The outputs to the first and second portions of memory elements may be provided by separate buffer outputs of the buffer 240/250/260 of FIG. 2. That is, the voltage values generated at the outputs of the buffer 240/250/260 may be different depending upon the operation is a read or write operation. Configuring the buffer may comprise configuring the buffer to receive a supply reference voltage and generating a first reference voltage to enable a write operation and a second reference voltage to enable a read operation.

Figure 5:
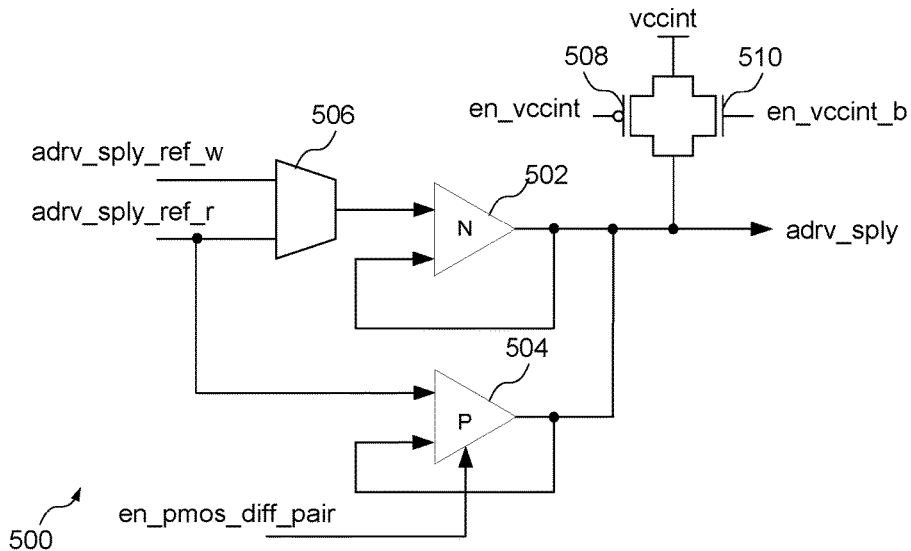
FIG. 5 is a block diagram of a buffer for enabling accessing memory elements of an integrated circuit device.

Turning now to FIG. 5, a block diagram of a buffer 500 for enabling accessing memory elements of an integrated circuit device is shown. In particular, the buffer of FIG. 5, which may be implemented as the buffer 106 of FIG. 1 or buffers 240, 250 and 260 of FIG. 2 for example, is configured to selectively implement an NMOS operational amplifier 502 and a PMOS operational amplifier 504. The NMOS operational amplifier comprises a first input coupled to receive the output of a multiplexer 506 that is adapted to receive a first reference voltage associated with a write operation (advr_sply_ref_w) and a second reference voltage associated with a read operation (advr_sply_ref_r). The output of the NMOS operational amplifier 502 is fed back to a second input as shown. The second reference voltage associated with a read operation is also coupled to a first input of a PMOS operational amplifier 504, which has an output that is fed back to a second input as shown. The PMOS operational amplifier is coupled to receive a PMOS enable (en_pmos_diff_pair) signal to enable the use of the PMOS operational amplifier. An output reference supply signal (adrv_sply) is generated at the output of the NMOS operational amplifier 502 and the PMOS operational amplifier 504, which are also coupled to a PMOS pull-up transistor 508 coupled to receive an enable signal (en_vccint) and a NMOS pull-up transistor 510 coupled to receive an enable signal (en_vccint_b). As will be described in more detail below in reference to FIG. 6, the NMOS and PMOS operational amplifiers may be implemented as differential amplifiers as shown in FIG. 6.

Figure 6:
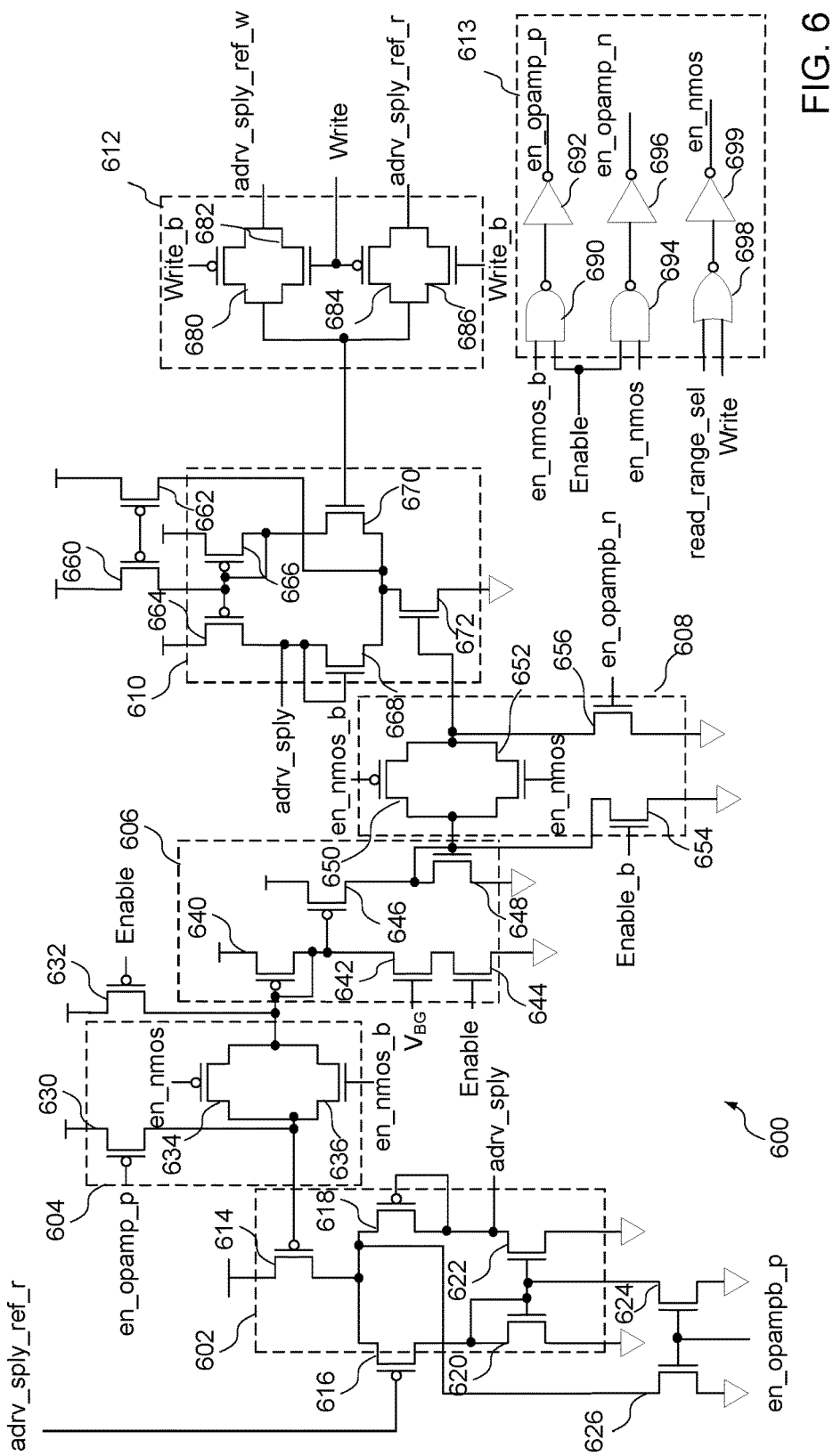
FIG. 6 is an exemplary block diagram for implementing the buffer of FIG. 5.

Turning now to FIG. 6, an exemplary block diagram of a buffer 600 that could be implemented as buffer 500 of FIG. 5 is shown. More particularly, the buffer comprises a PMOS buffer 602, a switch 604, a bias generator 606, a switch 608, a NMOS buffer 610, a multiplexer 612 and a control circuit 613. The PMOS buffer 602 comprises a first PMOS transistor 614 coupled between a reference voltage (e.g. Vccaux) and sources of a pair of PMOS transistors 616 and 618 that are coupled to the drain of transistor 614. The drains of the PMOS transistors 616 and 618 are coupled to drains of NMOS transistors 620 and 622, respectively, where the gates of the NMOS transistors 620 and 622 are coupled together and to the drain of transistor 620. The sources of the transistors 618 and 616 are coupled to a drain of a NMOS transistor 626 having a source coupled to ground. The gates of transistors 620 and 622 are coupled to a drain of an NMOS transistor 624, a source of which is also coupled to ground, where the gates of the transistors 624 and 626 are coupled together. The gate of transistor 616 is coupled to receive the read reference voltage (adrv_sply_ref_r), while the gate of transistor 618 is coupled to its drain.

The switch 604 comprises a PMOS transistor 630 coupled between a reference voltage and the drains of a PMOS transistor 634 and a NMOS transistor 636, and a PMOS transistor 632 is coupled between the reference voltage and the sources of the PMOS transistor 634 and the NMOS transistor 636. The PMOS transistor 630 is coupled to receive an enable signal (en_opamp_p) at its gate, while the PMOS transistor 632 is coupled to receive an enable (Enable) signal at its gate. The gates of the transistors 634 and 636 are coupled to receive NMOS enable signals, where the PMOS transistor 634 is coupled to receive an enable (en_n- mos) signal at its gate and the NMOS transistor 636 is coupled to receive an inverted (en_nmos_b) signal at its gate. The supply voltage (adrv_sply) provided to the line driver and the line driver buffers is generated at the drain of transistor 622. It should be noted that the supply voltage adrv_sply generated by the PMOS buffer 602 and the NMOS buffer 610 may have a different voltage depending upon whether a read operation is performed or a write operation is performed using one of the read supply voltage adrv_sply_ref_r or the write supply voltage adrv_sply_ref_r is used, as will be described in more detail below.

The bias generator 606 comprises a first current path having a PMOS transistor 640 coupled in series with NMOS transistors 642 and 644. The gate of transistor 640 is coupled to the drain of PMOS transistor 632 and to its drain. The gate of transistor 642 is coupled to receive a bias generator voltage VBG and the gate of transistor 644 is coupled to receive the Enable signal. A current mirror arrangement comprising an PMOS transistor 646 having a gate coupled to the drain of transistor 640 and a NMOS transistor 648 having a gate coupled to its drain is implemented to mirror the current in the current path having transistors 640-644.

Switch 608 comprises a pair of transistors 650 and 652 configured as a pass gate, where the sources of transistors 650 and 652 are coupled together and to the gate of transistor 648 and the drains of the transistors 650 and 652 are coupled together. A NMOS transistor 654 having a gate coupled to receive the inverted enable (Enable_b) signal is coupled to the sources of transistors 650 and 652. A NMOS transistor 656 configured to receive an enable (en_opampb_n) signal at its gate has a drain coupled to the drains of the transistors 650 and 652.

The NMOS buffer 610 comprises a pair of PMOS transistors 660 and 662 having their gates connected together, and comprises a PMOS transistor 664 having a gate coupled to a PMOS transistor 666. The drain of the transistor 664 is coupled to a drain and gate of NMOS transistor 668. A gate of the transistor 666 is coupled to its drain and to the drain of a transistor 670. The sources of the transistors 668 and 670 are coupled together and to the drain of a transistor 672 having a gate coupled to the drain of the transistor 656. The supply voltage (adrv_sply) is generated at the drains of the transistors 664 and 668.

The multiplexer 612 is configured to control the transistor 670, and comprises a first pair of pass transistors having their sources and drains connected together and includes a PMOS transistor 680 coupled to receive an inverted write (Write_b) signal at its gate and a NMOS transistor 682 configured to receive a write (Write) signal at its gate. The pair of transistors 680 and 682 pass a write reference voltage (advr_sply_ref_w) signal to control the gate of transistor 670. The multiplexer 612 also comprises a second pair of pass transistors having their sources and drains connected together and includes a PMOS transistor 684 coupled to receive the write signal at its gate and an NMOS transistor 686 coupled to receive the inverted write signal at its gate. The transistors 684 and 686 are configured to pass the read reference voltage (adrv_sply_ref_r) signal. One of the read reference supply voltages and the write supply voltage is selected by the multiplexer 612, where the selected read or write reference supply voltage is provided to the NMOS buffer 610.

The control circuit 613 comprises logic gate for generating signals used by the buffer 600. More particularly, a NAND gate 690 is configured to receive the inverted NMOS enable (en_nmos_b) signal and the enable (Enable) signal and generate enable (en_opamp_p) signal at the output of an inverter 692. A NAND gate 694 is configured to receive the NMOS enable (en_nmos) signal and the enable (Enable) signal and generate an enable (en_opamp_n) signal at the output of an inverter 696. An exclusive OR gate 698 is configured to read a read range select (read_range_sel) signal and the write (Write) signal, and generate the enable NMOS (en_nmos) signal at an output of an inverter 699.

In operation, the buffer 600 generates supply voltages for address line drivers, and implements a current mirror. The buffer 600 passes the configuration read/write reference voltages generated from the address supply reference generator to address line drivers. The buffer may have 2 modes of operation including a memory write operation and a memory read operation based upon the en_nmos signal. The buffer passes a write reference voltage (adrv_sply_ref_w) during a write, where the write address supply voltage is the function of Vgg (Temperature)[Va=1.1*Vgg]. The buffer passes a read reference voltage (adrv_sply_ref_r) (550 mV to 850 mV) during read operation. That is, the supporting range of signals received by the buffer 600 is 550 mV-850 mV for read operations, while during write operations, the write reference voltage can vary with temperature, and can be between 0.95V and 1.16V. The multiplexer 612 passes write/read reference supply voltages to NMOS buffer 610 based on the read/write mode and a voltage range in read mode. The control logic selects the PMOS buffer 602 or the NMOS buffer 610 based on read range and write signal. It should also be noted that a single bias generator 606 is used for both the PMOS buffer 602 and the NMOS buffer 610.

The PMOS buffer 602 and the NMOS buffer 610 are used to provide voltage supplies to address line drivers. In order to improve read range, a control feature is provided, where the circuit can dynamically switch between NMOS or PMOS buffers implemented as asymmetrical differential pairs. The implementation of the circuit of FIG. 6 supports a VCCAUX supply as low as 1.35 v, and meets a read range of approximately 0.55 v to 0.85 v and write range of approximately 0.7 v to 1.2 v by sharing the same NMOS differential pair in both read and write modes above 0.7 v. According to one implementation, the PMOS buffer or the NMOS buffer may be selected during the following different conditions. During a read mode if the range is between 0.55 v to 0.7 v, then the PMOS buffer is ON and the NMOS buffer is OFF. The output adrv_sply of the PMOS buffer 602 will be used to provide a reference voltage to the line drivers and line driver buffers that are enabled to access memory elements. During a read mode, if the range is between 0.7 v to 0.85 v, then the PMOS buffer is OFF and the NMOS buffer is ON. In this read mode operation, the output adrv_sply of the NMOS buffer 610 will be used to provide a reference voltage to the line drivers and line driver buffers that are enabled to access memory elements. During a write mode, which supports a range from 0.7 v to 1.2 v, then the PMOS buffer is OFF and the NMOS buffer is ON. That is, during this write mode operation, the output adrv_sply of the NMOS buffer 610 will be used to provide a reference voltage to the line drivers and line driver buffers that are enabled to access memory elements.

Figure 7:
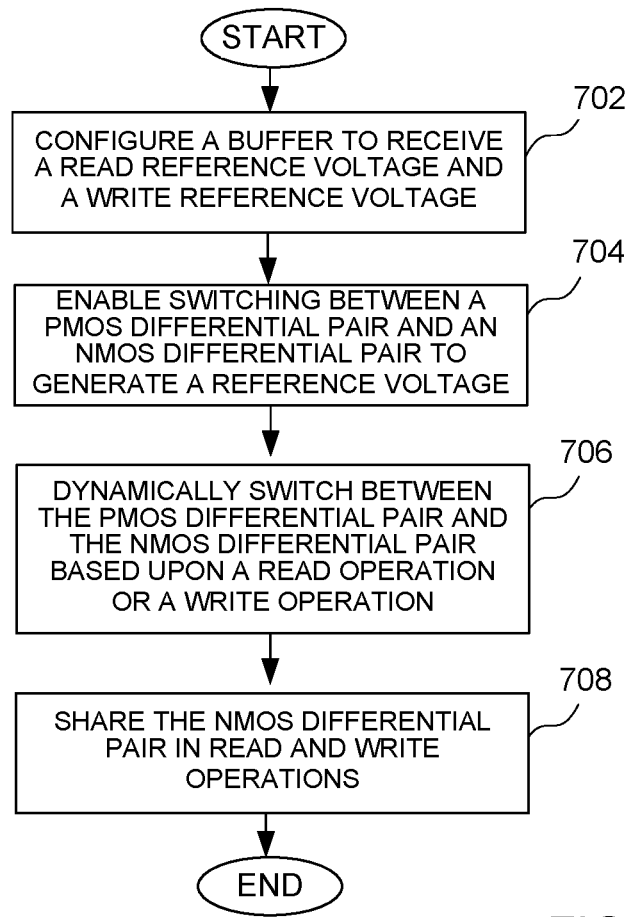
FIG. 7 is a flow diagram describing another method of accessing memory elements in an integrated circuit device.

Turning now to FIG. 7, a flow diagram describes another method of accessing memory elements in an integrated circuit device. A buffer for generating a reference voltage as a supply voltage for line drivers and line driver buffers, such as buffer 500 of FIG. 5 or buffer 600 of FIG. 6 for example, is configured to receive a read supply voltage and a write supply voltage at a block 702. Switching between a PMOS differential pair and an NMOS differential pair is enabled to generate a reference voltage used as a supply voltage for the line driver at a block 704. The PMOS differential pair and the NMOS differential pair are dynamically switching based upon a read operation or a write operation at a block 706, where the NMOS differential pair is shared during read and write operations at a block 708.

The various elements of the methods of FIG. 7 may be implemented using the circuits of FIGS. 1-6 as described, or using some other suitable circuits. While specific elements of the method are described, it should be understood that additional elements of the method, or additional details related to the elements, could be implemented according to the disclosure of FIGS. 1-6.

It can therefore be appreciated that new circuits for and methods of accessing memory elements in an integrated circuit have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for accessing memory elements in an integrated circuit device, the circuit comprising:
   a first plurality of memory elements;
   first line drivers, each of the first line drivers configured to provide a signal to a memory element of the first plurality of memory elements;
   first line driver buffers configured to control the signals provided by the first line drivers to the first plurality of memory elements, wherein each line driver buffer of the first line driver buffers is configured to receive power, and each line driver of the first line drivers drives a plurality of line driver buffers of the first line driver buffers;
   wherein, for each line driver of the first line drivers, a switch of a first plurality of switches is coupled between the line driver and the plurality of line driver buffers driven by the line driver;
   a second plurality of memory elements;
   second line drivers, each of the second line drivers configured to provide a signal to a memory element of the second plurality of memory elements;
   second line driver buffers configured to control the signals provided by the second line drivers to the second plurality of memory elements, wherein each line driver buffer of the second line driver buffers is configured to receive power, and each line driver of the second line drivers drives a plurality of line driver buffers of the second line driver buffers;
   wherein, for each line driver of the second line drivers, a switch of a second plurality of switches is coupled between the line driver and the plurality of line driver buffers driven by the line driver;
   wherein power provided to the first line driver buffers is disabled during a configuration of the second memory cells; and
   wherein power provided to the second line driver buffers is disabled during a configuration of the first memory cells.

2. The circuit of claim 1, wherein the first line drivers drive address lines associated with the first plurality of memory elements and the second line drivers drive address lines associated with the second plurality of memory elements.

3. The circuit of claim 1, wherein the first plurality of memory elements and the second plurality of memory elements comprise distributed random access memory of the integrated circuit device.

4. The circuit of claim 1, further comprising a buffer configured to receive a supply reference voltage and generate a first reference voltage for the first line driver buffers and a second reference voltage for the second line driver buffers.

5. The circuit of claim 4, wherein the buffer is coupled to the first line drivers and the second line drivers and enables a partial reconfiguration of the integrated circuit device.

6. The circuit of claim 4, wherein the buffer is configured to receive the supply reference voltage and generate the first reference voltage to enable a write operation and the second reference voltage to enable a read operation.

7. The circuit of claim 4, wherein the buffer is configured to receive a read reference voltage and a write reference voltage.

8. The circuit of claim 4, wherein the buffer is configured to receive the supply reference voltage and to switch between a PMOS differential pair and an NMOS differential pair to generate one of the first reference voltage or the second reference voltage.

9. The circuit of claim 8, wherein the buffer enables dynamically switching between the PMOS differential pair and the NMOS differential pair based upon a read operation or a write operation to generate one of the first reference voltage or the second reference voltage.

10. The circuit of claim 4, wherein the buffer provides a power supply grid for the first line drivers, the first line driver buffers, the second line drivers, and the second line driver buffers.

11. A method for accessing memory elements in an integrated circuit device, the circuit comprising:
    configuring each line driver of a first plurality of line drivers to provide a signal to a memory element of the first plurality of memory elements;
    configuring first line driver buffers to control the signals provided by the first line drivers to the first plurality of memory elements, wherein each line driver buffer of the first line driver buffers is configured to receive power, and each line driver of the first line drivers drives a plurality of line driver buffers of the first line driver buffers;
    coupling, for each line driver of the first line drivers, a switch of a first plurality of switches between the line driver and the plurality of line driver buffers driven by the line driver;
    configuring each line driver of a second plurality of line drivers to provide a signal to a memory element of a second plurality of memory elements;
    configuring second line driver buffers to control the signals provided by the second line drivers to the second plurality of memory elements, wherein each line driver buffer of the second line driver buffers is configured to receive power, and each line driver of the second line drivers drives a plurality of line driver buffers of the second line driver buffers;
    coupling, for each line driver of the second line drivers, a switch of a second plurality of switches between the line driver and the plurality of line driver buffers driven by the line driver;
    disabling power provided to the first line driver buffers during a configuration of the second memory cells; and
    disabling power provided to the second line driver buffers during a configuration of the first memory cells.

12. The method of claim 11, wherein the first line drivers drive address lines associated with the first plurality of memory elements and the second line drivers drive address lines associated with the second plurality of memory elements.

13. The method of claim 11, wherein the first plurality of memory elements and the second plurality of memory elements comprise distributed random access memory of the integrated circuit device.

14. The method of claim 11, further comprising configuring a buffer to receive a supply reference voltage and generate a first reference voltage for the first line driver buffers and a second reference voltage for the second line driver buffers.

15. The method of claim 14, wherein configuring the buffer comprises coupling the buffer to the first line drivers and the second line drivers and enabling a partial reconfiguration of the integrated circuit device.

16. The method of claim 14, wherein configuring the buffer comprises configuring the buffer to receive the supply reference voltage and generate the first reference voltage to enable a write operation and the second reference voltage to enable a read operation.

17. The method of claim 14, wherein configuring the buffer comprises configuring the buffer to receive a read reference voltage and a write reference voltage.

18. The method of claim 14, wherein configuring the buffer comprises configuring the buffer to receive the supply reference voltage and to switch between a PMOS differential pair and an NMOS differential pair to generate one of the first reference voltage or the second reference voltage.

19. The method of claim 18, further comprising dynamically switching between the PMOS differential pair and the NMOS differential pair based upon a read operation or a write operation to generate one of the first reference voltage or the second reference voltage.

20. The method of claim 14, wherein configuring a buffer comprises providing a power supply grid for the first line drivers, the first line driver buffers, the second line drivers, and the second line driver buffers.

* * * * *